(12) United States Patent
Matsumoto et al.

(10) Patent No.: US 7,829,463 B2
(45) Date of Patent: Nov. 9, 2010

(54) PLASMA PROCESSING METHOD AND PLASMA PROCESSING APPARATUS

(75) Inventors: Naoki Matsumoto, Amagasaki (JP); Chishio Koshimizu, Nirasaki (JP); Manabu Iwata, Nirasaki (JP); Satoshi Tanaka, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 893 days.

(21) Appl. No.: 11/694,126

(22) Filed: Mar. 30, 2007

(65) Prior Publication Data
US 2007/0227665 A1  Oct. 4, 2007

Related U.S. Application Data

(60) Provisional application No. 60/791,464, filed on Apr. 13, 2006.

(30) Foreign Application Priority Data

Mar. 30, 2006 (JP) .............................. 2006-092939

(51) Int. Cl.
*H01L 21/44* (2006.01)
(52) U.S. Cl. ...................... 438/676; 438/726; 438/727; 438/729; 438/730; 438/758; 438/798; 118/723 R; 118/723 E; 118/625; 257/E21.143
(58) Field of Classification Search ................ 438/676, 438/758, 726–730, 798, FOR. 117; 118/723 R, 118/723 E, 625; 257/E21.143
See application file for complete search history.

(56) References Cited

U.S. PATENT DOCUMENTS

| 5,494,522 | A | | 2/1996 | Moriya et al. | |
|---|---|---|---|---|---|
| 6,127,275 | A | * | 10/2000 | Flamm | 438/710 |
| 6,251,792 | B1 | * | 6/2001 | Collins et al. | 438/710 |
| 6,518,195 | B1 | * | 2/2003 | Collins et al. | 438/723 |
| 6,852,243 | B2 | * | 2/2005 | Jurgensen et al. | 216/71 |
| 6,858,548 | B2 | * | 2/2005 | Won et al. | 438/786 |
| 7,153,387 | B1 | | 12/2006 | Tomoyasu | |
| 2001/0036744 | A1 | * | 11/2001 | Taravade et al. | 438/729 |
| 2004/0154540 | A1 | | 8/2004 | Hayami et al. | |
| 2005/0257743 | A1 | | 11/2005 | Koshiishi et al. | |
| 2006/0037704 | A1 | | 2/2006 | Iwata et al. | |

(Continued)

FOREIGN PATENT DOCUMENTS

CN      1717788 A      1/2006

(Continued)

*Primary Examiner*—Michelle Estrada
(74) *Attorney, Agent, or Firm*—Oblon, Spivak, McClelland, Maier & Neustadt, L.L.P.

(57) ABSTRACT

A plasma processing method performs a desired plasma process on substrates by using a plasma generated in a processing space. A first and a second electrode are disposed in parallel in a processing vessel that is grounded, the substrate is supported on the second electrode to face the first electrode, the processing vessel is vacuum evacuated, a desired processing gas is supplied into the processing space formed between the first electrode, the second electrode and a sidewall of the processing vessel, and a first radio frequency power is supplied to the second electrode. The first electrode is connected to the processing vessel via an insulator or a space, and is electrically coupled to a ground potential via a capacitance varying unit whose electrostatic capacitance is varied based on a process condition of the plasma process performed on the substrate.

18 Claims, 8 Drawing Sheets

U.S. PATENT DOCUMENTS

2007/0155185 A1 * 7/2007 Rauf .......................... 438/775

FOREIGN PATENT DOCUMENTS

| | | |
|---|---|---|
| CN | 1734712 A | 2/2006 |
| JP | 6-283474 | 10/1994 |
| KR | 2002-0027561 | 4/2002 |
| KR | 10-2004-0073355 | 8/2004 |

* cited by examiner

PLASMA PROCESSING METHOD AND PLASMA PROCESSING APPARATUS

CROSS-REFERENCE TO RELATED APPLICATIONS

This document claims priority to Japanese Patent Application No. 2006-92939, filed on Mar. 30, 2006 and U.S. Provisional Application No. 60/791,464, filed on Apr. 13, 2006, the entire content of which are hereby incorporated by reference.

FIELD OF THE INVENTION

The present invention relates to a technique for performing a plasma process on a substrate to be processed; and, more particularly, to a capacitively coupled plasma processing apparatus and plasma processing method.

BACKGROUND OF THE INVENTION

In a manufacturing process of semiconductor devices or flat panel displays (FPDs), a plasma is used to perform a processing, such as etching, deposition, oxidation, sputtering or the like, so as to obtain a good reaction of a processing gas at a relatively low temperature. Conventionally, a capacitively coupled type plasma apparatus has been widely employed as a single-wafer plasma processing apparatus, especially, as a single-wafer plasma etching apparatus.

Generally, in the capacitively coupled plasma processing apparatus, an upper electrode and a lower electrode are disposed to face each other in parallel in a vacuum processing chamber, a substrate to be processed (a semiconductor wafer, a glass substrate or the like) is mounted on the upper electrode, and a radio frequency voltage is applied to either one of the upper and the lower electrode. Electrons are accelerated by an electric field formed by the radio frequency voltage to collide with a processing gas. As a result of ionization by the collision between the electrons and the processing gas, a plasma is generated, and a desired microprocessing (for example, etching) is performed on the surface of the substrate by radicals or ions in the plasma. At this time, the electrode to which the radio frequency voltage is applied is connected with a radio frequency power supply via a blocking capacitor in a matching unit and thus serves as a cathode.

A cathode coupling method in which the radio frequency voltage is applied to the lower electrode, serving as the cathode, for supporting the substrate enables an anisotropic etching by substantially vertically attracting ions in the plasma to the substrate with a self-bias voltage generated in the lower electrode. Further, the cathode coupling type, when used in a process in which deposits such as polymer tend to readily stick to the upper electrode, has an advantage in that deposit films (and, if attached, oxide films as well) can be removed by sputtering, i.e., by impacts of ions incident on the upper electrode.

(Patent Reference 1) Japanese Patent Laid-open Application No. H6-283474 & U.S. Pat. No. 5,494,522

In the conventional capacitively coupled plasma processing apparatus of the cathode coupling type, the upper electrode on the anode side without being supplied with a radio frequency power is usually DC-wise grounded. Since the processing vessel usually is made of metal such as aluminum or stainless steel and is frame-grounded, the upper electrode can be configured to be of a ground potential via the processing vessel. For the reason, the upper electrode is connected to the ceiling of the processing vessel to form a single body therewith, or the ceiling of the processing vessel itself is used as the upper electrode.

With a recent trend of miniaturization of design rules for the manufacturing process, a high-density plasma is required to be available at a low pressure for a plasma process. In the capacitively coupled plasma processing apparatus as described above, the frequency of the radio frequency power tends to be gradually increased and a frequency of 40 MHz or greater is standardly used in recent years. However, if the frequency of the radio frequency power becomes high, a radio frequency current is made to be concentrated on a central portion of the electrode, so that a density of a plasma generated in a processing space between two electrodes becomes higher at the central portion of the electrode than that at the edge portion thereof. As a result, there occurs a problem that an in-surface uniformity of the process is considerably deteriorated.

SUMMARY OF THE INVENTION

It is, therefore, a first object of the present invention to provide a plasma processing method and a plasma processing apparatus capable of improving a uniformity of a plasma processing in a cathode coupling arrangement, while preventing a deposit film from adhering to an anode-side electrode to affect subsequent processes.

It is a second object of the present invention to provide a plasma processing method and a plasma processing apparatus capable of stably maintaining the uniformity of the plasma process even if a change in processing environments occurs with a lapse of time as the plasma processing is repeatedly performed.

To achieve the first object, in accordance with a first aspect of the present invention, there is provided a plasma processing method for performing a desired plasma process on substrates by using a plasma generated in a processing space, wherein a first and a second electrode are disposed in parallel to each other with a specific interval in a processing vessel that is grounded and capable of being vacuum evacuated, the substrate is supported on the second electrode to face the first electrode, the processing vessel is vacuum evacuated to a specific pressure level, a desired processing gas is supplied into the processing space formed between the first electrode, the second electrode and a sidewall of the processing vessel, and a first radio frequency power is supplied to the second electrode to generate the plasma in the processing space, and wherein the first electrode is connected to the processing vessel via an insulator or a space, and is electrically coupled to a ground potential via a capacitance varying unit whose electrostatic capacitance is variable, and the electrostatic capacitance of the capacitance varying unit is controlled based on a process condition of the plasma process performed on the substrate.

In accordance with a second aspect of the present invention, there is provided a plasma processing apparatus including a processing vessel that is grounded and capable of being vacuum evacuated; a first electrode connected to the processing vessel via an insulator or a space; a capacitance varying unit whose electrostatic capacitance is variable, electrically connected between the first electrode and a ground potential; a second electrode disposed in the processing vessel to be in parallel to the first electrode with a specific interval, for supporting a target substrate thereon to face the first electrode; a processing gas supply unit for supplying a processing gas into a processing space between the first electrode, the second electrode and a sidewall of the processing vessel; a first radio frequency power supply unit for applying a first radio frequency power to the second electrode to generate a plasma of the processing gas in the processing space; and a capacitance control unit for controlling the electrostatic capacitance of the capacitance varying unit based on a process condition of a plasma process performed on the substrate.

In accordance with a capacitively coupled arrangement arrangements of the first and second aspects of the present invention, when the radio frequency power from the radio frequency power supply unit is applied to the second electrode, a plasma of the processing gas is generated in the processing space by a radio frequency discharge between the first and the second electrode and that between the second electrode and the sidewall of the chamber. The plasma thus generated is diffused in all directions, especially in upward and radially outward directions. Electron current in the plasma flows toward the ground via the first electrode, the sidewall of the chamber or the like.

Hence, by changing the electrostatic capacitance of the capacitance varying unit based on the process condition of the plasma process, the electrostatic capacitance around the first electrode or the ground capacitance can be converted, if necessary, from the high capacitance (low impedance) to the low capacitance (high impedance). Particularly, in the high capacitance (low impedance) mode, a proportion of electron current that flows between the first and the second electrode can be increased among the total electron current of the plasma, so that a sputtering effect of ions can be intensified with respect to the first electrode. Therefore, the high capacitance mode is suitable for such processes in which deposits like polymer and so forth are easily attached to the second electrode.

On the other hand, in the low capacitance (high impedance) mode, a proportion of electron current that flows between the first electrode and the sidewall of the chamber can be increased among the total electron current of the plasma, so that the spatial density distribution of the plasma is enlarged outwardly in the radial direction. Therefore, the low capacitance mode is suitable for such a process in which the process uniformity is important, or for such a process (e.g., a process that is finally performed) in which no problem is caused by deposits being attached on the second electrode.

It is also possible that a second radio frequency power, whose frequency is lower than that of the first radio frequency power, is applied to the second electrode, or a DC voltage is controllably applied to the first electrode.

To achieve the second object, in accordance with a third aspect of the present invention, there is provided a plasma processing method for performing a desired plasma process on substrates by using a plasma generated in a processing space, wherein a first and a second electrode are disposed in parallel to each other with a specific interval in a processing vessel capable of being vacuum evacuated, the substrate is supported on the second electrode to face the first electrode, the processing vessel is vacuum evacuated to a specific pressure level, a desired processing gas is supplied into the processing space formed between the first electrode, the second electrode and a sidewall of the processing vessel, and a first radio frequency power is supplied to the second electrode to generate the plasma in the processing space, and wherein the first electrode is connected to the processing vessel via an insulator or a space, and is electrically coupled to a ground potential via a capacitance varying unit whose electrostatic capacitance is variable, and the electrostatic capacitance of the capacitance varying unit is controlled based on the number of substrates on which the plasma process is performed.

In accordance with a fourth aspect of the present invention, there is provided a plasma processing apparatus including a processing vessel that is grounded and capable of being vacuum evacuated; a first electrode connected to the processing vessel via an insulator or a space; a capacitance varying unit whose electrostatic capacitance is variable, electrically connected between the first electrode and a ground potential; a second electrode disposed in the processing vessel to be in parallel to the first electrode with a specific interval, for supporting a target substrate thereon to face the first electrode; a processing gas supply unit for supplying a processing gas into a processing space between the first electrode, the second electrode and a sidewall of the processing vessel; a first radio frequency power supply unit for applying a first radio frequency power to the second electrode to generate a plasma of the processing gas in the processing space; and a capacitance control unit for controlling the electrostatic capacitance of the capacitance varying unit based on the number of substrates on which the plasma process is performed.

In accordance with the third and the fourth aspect of the present invention, the electrostatic capacitance of the capacitance varying unit is controlled based on the number of plasma-processed substrates, so that the spatial density distribution of the plasma and the in-surface variance of the process can be controlled. Thus, the uniformity of the process can be stably secured.

It is preferable that the capacitance control unit sets the electrostatic capacitance of the capacitance varying unit to be high in advance, and to be reduced as the number of substrates on which the plasma process is performed increases.

In accordance with the plasma processing method and the plasma processing apparatus of the present invention, with the configurations and functions described above, deposits can be prevented from being attached to an electrode on an anode side and thus affecting the subsequent processes in a cathode coupling arrangement, and the uniformity of the process can be enhanced. Further, even if a change in processing environments occurs with a lapse of time as the plasma processing is repeatedly performed, the uniformity of the plasma processing can be stably maintained.

BRIEF DESCRIPTION OF THE DRAWINGS

The above and other objects and features of the present invention will become apparent from the following description of embodiments given in conjunction with the accompanying drawings, in which.

DETAILED DESCRIPTION OF THE EMBODIMENTS

Hereinafter, embodiments of the present invention will be described with reference to the accompanying drawings.

Figure 1:
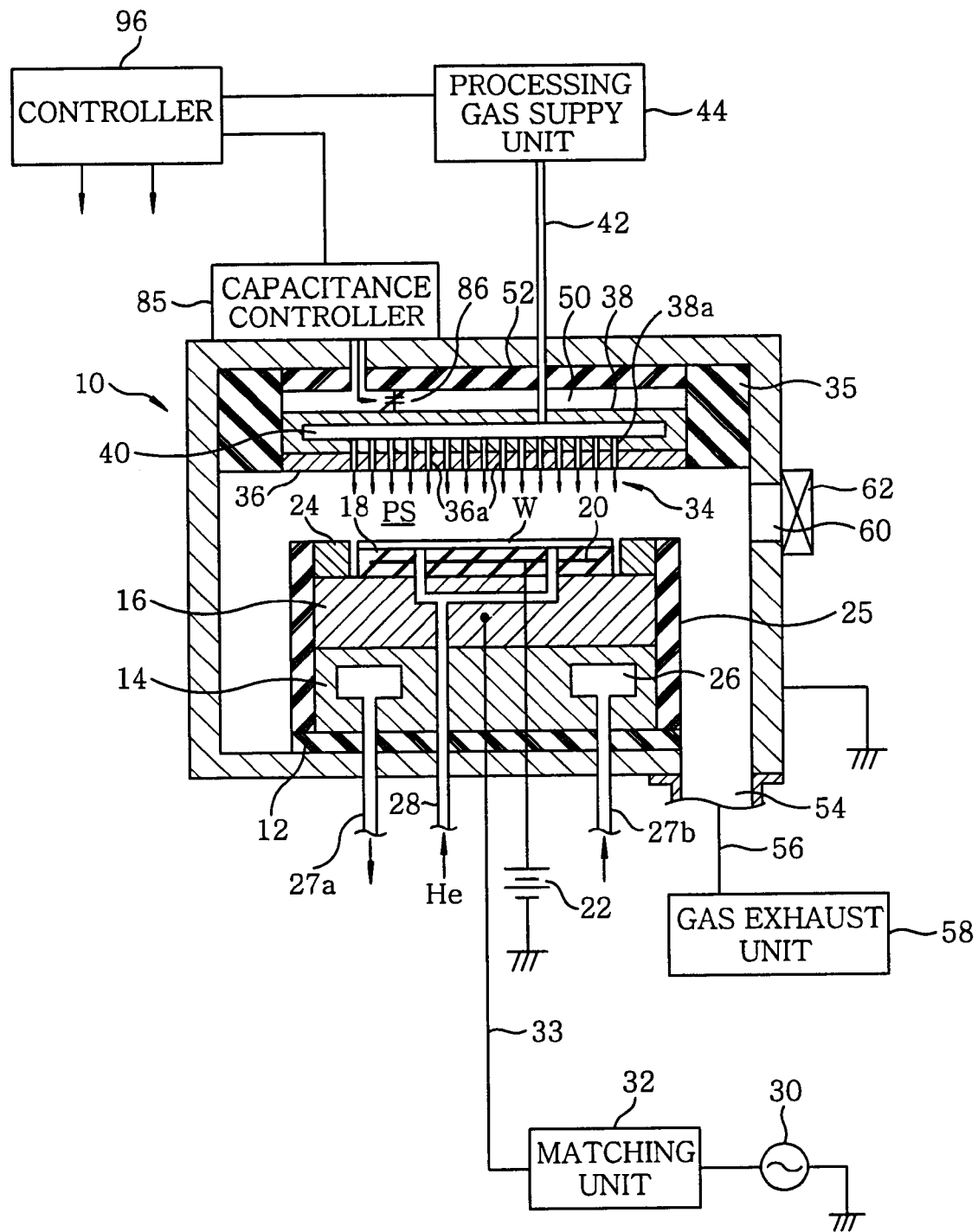
FIG. 1 is a longitudinal cross sectional configuration view of a plasma etching apparatus in accordance with an embodiment of the present invention.

FIG. 1 illustrates a configuration of a plasma processing apparatus in accordance with an embodiment of the present invention. The plasma processing apparatus is configured as a capacitively coupled (parallel plate type) plasma processing apparatus of a cathode coupling type. The plasma processing apparatus has a cylindrical vacuum chamber (processing chamber) 10 made of, e.g., an aluminum whose surface is alumite-treated (anodically oxidized), and the chamber 10 is frame grounded.

A cylindrical susceptor support 14 is provided at a bottom portion in the chamber 10 via an insulation plate 12 made of ceramic or the like. Further, a susceptor 16 made of, e.g., aluminum, is disposed above the susceptor support 14. The susceptor 16 serves as a lower electrode and a target substrate, e.g., a semiconductor wafer W, is mounted thereon.

On the top surface of the susceptor 16, there is disposed an electrostatic chuck 18 for attracting and holding the semiconductor wafer with an electrostatic adsorptive force. The electrostatic chuck 18 includes an electrode 20 formed of a conductive film which is inserted between a pair of insulating layers or sheets. A DC power supply 22 is connected to the electrode 20. The electrostatic chuck 18 is allowed to attract and hold the semiconductor wafer W thereon with a Coulomb force generated by a DC voltage applied from the DC power supply 22 thereto. A focus ring 24 made of, e.g., silicon is disposed to surround the electrostatic chuck 18 to improve an etching uniformity. Further, an inner wall member 25 made of, e.g., quartz is attached to the side surfaces of the susceptor 16 and the susceptor support 14.

A coolant path 26 is circumferentially provided inside the susceptor support 14. A coolant, e.g., cooling water, of a specific temperature is supplied into and circulated along the coolant path 26 from an external chiller unit (not shown) via coolant lines 27a, 27b. Accordingly, the processing temperature of the semiconductor wafer W on the susceptor 16 can be controlled by the temperature of the coolant. Further, a thermally conductive gas, e.g., He gas, is supplied into a gap between the top surface of the electrostatic chuck and the backside of the semiconductor wafer W from a thermally conductive gas supply unit (not shown) via a gas supply line 28.

A radio frequency power supply 30 for plasma generation is electrically connected to the susceptor 16 via a matching unit 32 and a power supply rod 33. The radio frequency power supply 30 applies a radio frequency power of a specific frequency, e.g., about 40 MHz, to the susceptor 16 when a plasma processing is performed in the chamber 10.

The upper electrode 34 is provided above the susceptor 16 to face the susceptor 16 in parallel. Further, the upper electrode 34 has an electrode plate 36 having a plurality of gas injection openings 36a and an electrode support 38 for detachably holding the electrode plate 36, the electrode plate 36 being made of a semiconductor material, e.g., Si, SiC or the like, the electrode support 38 being made of a conductive material, e.g., aluminum whose surface is alumite-treated. The upper electrode 34 is attached in a state electrically floating with respect to the chamber 10 via a ring-shaped insulator 35. A plasma generation space or a processing space PS is defined by the upper electrode 34, the susceptor 16 and the sidewall of the chamber 10.

The ring-shaped insulator 35, which is made of, e.g., alumina ($Al_2O_3$), is attached so that a gap between an outer peripheral surface of the upper electrode 34 and the sidewall of the chamber 10 can be airtightly sealed. The ring-shaped insulator 35 physically holds the upper electrode 34 and electrically forms a part of capacitance between the upper electrode 34 and the chamber 10.

The electrode support 38 has therein a gas buffer space 40 and also has on its bottom surface a plurality of gas ventholes 38a extending from the gas buffer space 40 to communicate with the gas injection openings 36a of the electrode plate 36. The gas buffer space 40 is connected with a processing gas supply source 44 via a gas supply line 42. When a specific processing gas is introduced from the processing gas supply source 44 into the gas buffer space 40, the processing gas is injected into the processing space PS toward the semiconductor wafer W on the susceptor 16 in a shower shape from the gas injection openings 36a of the electrode plate 36. So, the upper electrode 34 also serves as a shower head for supplying a processing gas into the processing space PS.

Further, the electrode support 38 has therein a passageway (not shown) through which a coolant, e.g., cooling water, flows, so that a temperature of the entire upper electrode 34, particularly the electrode plate 36, can be controlled to a specific level with the coolant supplied from an external chiller unit. In order to further stabilize the temperature control of the upper electrode 34, a heater (not shown) including, e.g., a resistance heating element may be attached to an inside or a top surface of the electrode support 39.

An interval of a specific size is formed between the top surface of the upper electrode 34 and the ceiling of the chamber 10, and a space 50 is formed therein. Though this space 50 may be formed as an atmospheric space, it is more preferable to configure it as a vacuum space. The space 50 serves to thermally insulate the upper electrode 34 from the chamber 10 or its vicinities, and to prevent an electrical discharge between the upper electrode 34 and the chamber 10 by excluding gases therefrom. In case of being configured as a vacuum space, the space 50 maintains the vacuum state independent of the processing space PS by means of an airtight structure thereof.

In this embodiment of the present invention, in order to enhance the effect of preventing the electrical discharge, an entire or partial region of the inner wall of the space 50 (only the top surface in case of the illustrated example) is covered with a sheet type insulator 52. While a polyimide resin having a high heat resistance can be appropriately employed as the insulator 52, Teflon (registered trademark) or quartz can also be employed as the insulator 52.

An annular space defined by the susceptor 16, the susceptor support 14 and the sidewall of the chamber 10 serves as a gas exhaust space. A gas exhaust port 54 of the chamber 10 is provided at a bottom of the gas exhaust space. A gas exhaust unit 58 is connected with the gas exhaust port 58 via a gas exhaust line 56. The gas exhaust unit 58 has a vacuum pump such as a turbo molecular pump or the like, so that the inside of the chamber 10, especially the processing space PS, can be depressurized to a required vacuum level. Moreover, attached to the sidewall of the chamber 10 is a gate valve 62 for opening and closing a loading/unloading port 60 for the semiconductor wafer W.

The plasma etching apparatus has a variable capacitor 86, whose capacitance can be varied, in the space 50, and the capacitance thereof is controlled by a capacitance control unit 85 installed outside the chamber 10, e.g., at the top surface thereof.

Here, configuration examples of the variable capacitor 86 will be explained with reference to FIGS. 2 and 3. The variable capacitor 86a shown in FIG. 2, which is an configuration example of the variable capacitor 86, includes a conductive plate 88a and a manipulation mechanism 90a such as a manipulation bar; and the variable capacitor 86b shown in FIG. 3, which is another configuration example of the variable capacitor 86, includes a conductive plate 88b and a manipulation mechanism 90b such as a manipulation bar. Each of the conductive plates 88a and 88b is movable between a first position near or in contact with the top surface of the upper electrode 34 and a second position upwardly apart from the upper electrode 34. Further, each of the manipulation mechanisms 90a and 90b moves the conductive plate 88a or 88b up and down. Herein, a capacitor is formed between the conductive plate 88a or 88b and the upper electrode 34. As an area of the conductive plate 88a or 88b becomes larger, a sensitivity or range of the capacitance variation increases.

Figure 2:
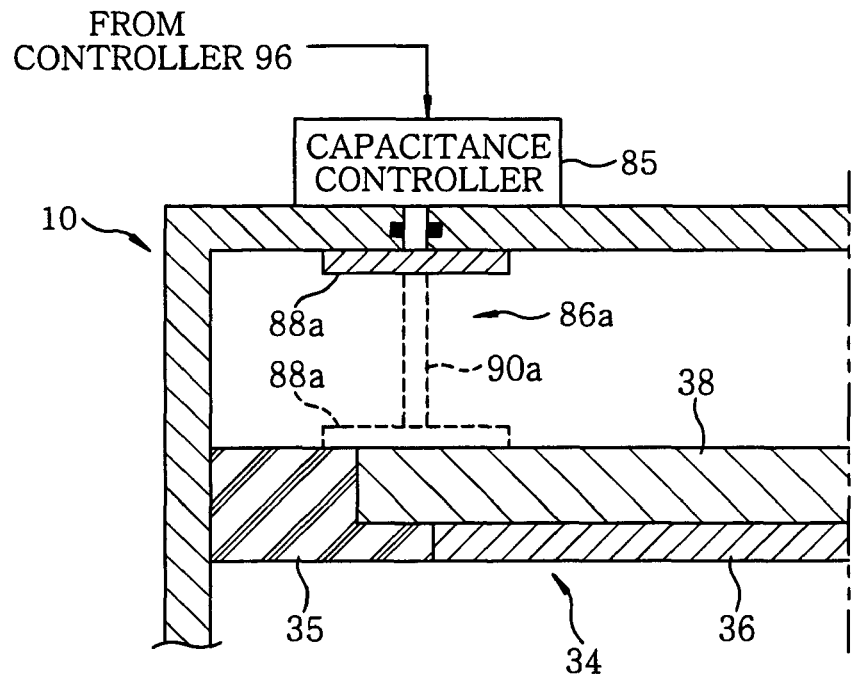
FIG. 2 sets forth a partial cross sectional view showing a configuration example of variable capacitor in the plasma etching apparatus in accordance with the embodiment of the present invention.
Figure 3:
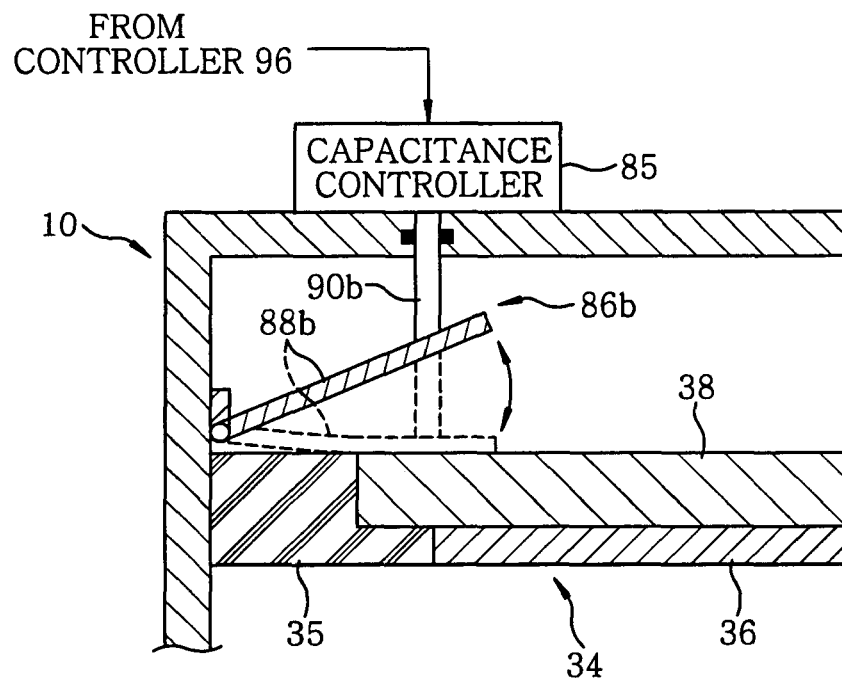
FIG. 3 presents a partial cross sectional view showing another configuration example of variable capacitor in the plasma etching apparatus in accordance with the embodiment of the present invention.

The manipulation mechanism 90a of FIG. 2 is made of a conductive material or a material that has a high conductivity at a radio frequency (or a material that has a low impedance at a radio frequency), and it is grounded directly or via the chamber 10. However, the manipulation mechanism 90b of FIG. 3 may be formed of an insulator. The capacitance control unit 85 includes, for example, a step motor whose rotation number can be controlled as desired, a motion converter (e.g., a ball screw mechanism) for converting a rotating motion of a driving shaft of the step motor into a linear (elevating) motion of the manipulation mechanism 90a or 90b, and the like.

The capacitance control unit 85 is capable of changing the capacitance of the variable capacitor 86 continuously by varying a height or a position of the conductive plate 88a or 88b. As the conductive plate 88a or 88b is moved closer to the ceiling surface of the chamber 10, the ground capacitance of the upper electrode 34 is reduced. On the contrary, the ground capacitance of the upper electrode 34 is increased as the conductive plate 88a or 88b is moved closer to the top surface of the upper electrode 34. In an extreme case, the ground capacitance of the upper electrode 34 can be made infinite by bringing the conductive plate 88a or 88b into contact with the upper electrode 34 to ground the upper electrode 34.

Figure 4:
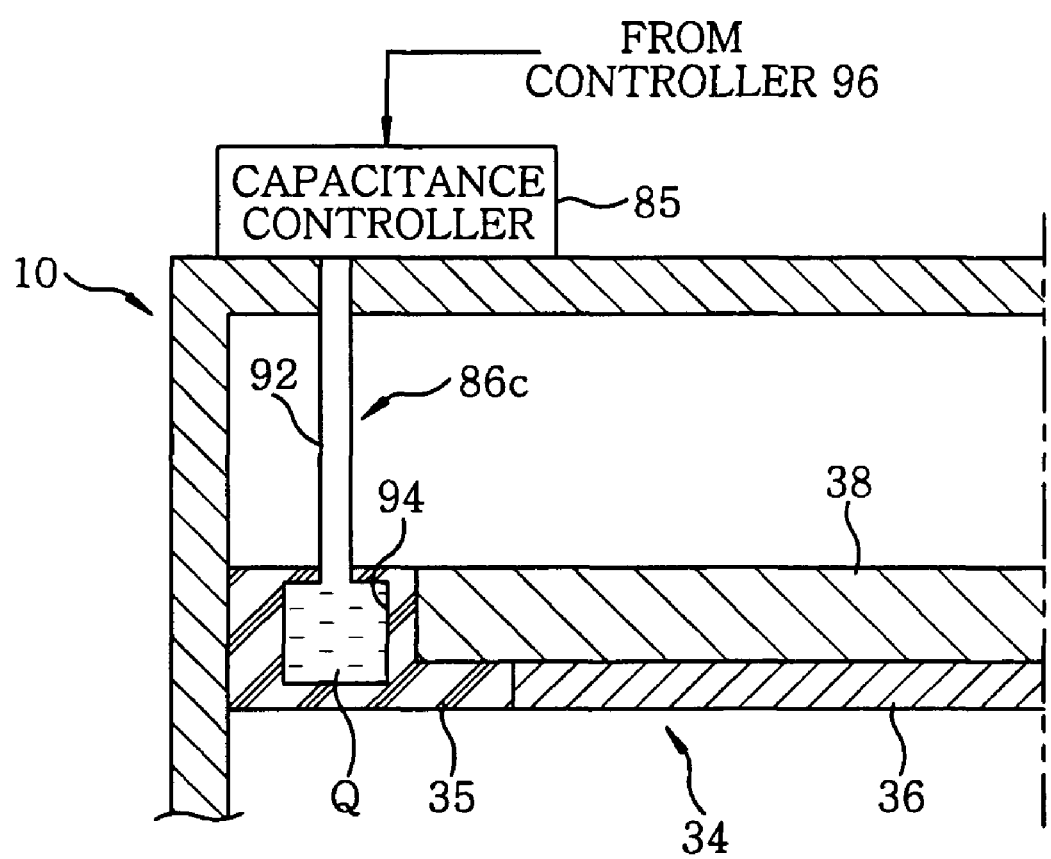
FIG. 4 offers a partial cross sectional view showing still another configuration example of the variable capacitor in the plasma etching apparatus in accordance with the embodiment of the present invention.

FIG. 4 illustrates a variable capacitor 86c, which is another configuration example of the variable capacitor 86. In this example, a ring-shaped liquid accommodation chamber 94 is formed in a ring-shaped insulator 35 provided between the upper electrode 34 and the sidewall of the chamber 10. A certain amount of liquid Q having an appropriate dielectric constant (e.g., an organic solvent such as galden) is capable of being put into or drawn out of the chamber 10 via a liquid line 92. By changing the substance (which determines the dielectric constant) or the amount of the liquid Q, the electrostatic capacitance of the entire ring-shaped insulator 35 and, further, the ground capacitance of the upper electrode 34 can be varied.

Further, a control signal that indicates a target value of capacitance of the variable capacitor 86 is inputted to the capacitance control unit 85 from a controller 96 that controls an operation of each component and an entire processing sequence of the plasma processing apparatus.

In the plasma etching apparatus, in order to perform an etching process, the gate valve 62 is opened and a semiconductor wafer W to be processed is loaded into the chamber 10 to be mounted on the electrostatic chuck 18. Then, a specific processing gas, i.e., an etching gas (generally, a gaseous mixture) is supplied into the chamber 10 from the processing gas supply unit 44 at a specified flow rate and flow rate ratio, while the chamber 10 is evacuated by the gas exhaust unit 58 such that the internal pressure of the chamber 10 is maintained at a specific vacuum level.

Further, a radio frequency power (40 MHz) of a specific power level is applied to the susceptor 16 from the radio frequency power supply 30. Further, a DC voltage is applied to the electrode 20 of the electrostatic chuck 18 from the DC power supply 46, whereby the semiconductor wafer W is firmly fixed on the electrostatic chuck 18. The etching gas injected from the upper electrode 34 as the shower head is converted into a plasma by a radio frequency discharge in the plasma space PS, and films formed on the main surface of the semiconductor wafer W are etched by radicals or ions present in the plasma.

By applying a radio frequency power of at least about 40 MHz to the susceptor (lower electrode) 16, this capacitively coupled plasma etching apparatus can increase the density of the plasma in an appropriately dissociated state. Thus, a high-density plasma under a low pressure can be generated. Further, since the plasma etching apparatus is of a cathode coupling type, an anisotropic etching can be performed by attracting ions in the plasma onto the wafer W substantially vertically by using a self-bias voltage generated in the susceptor 16.

Figure 5:
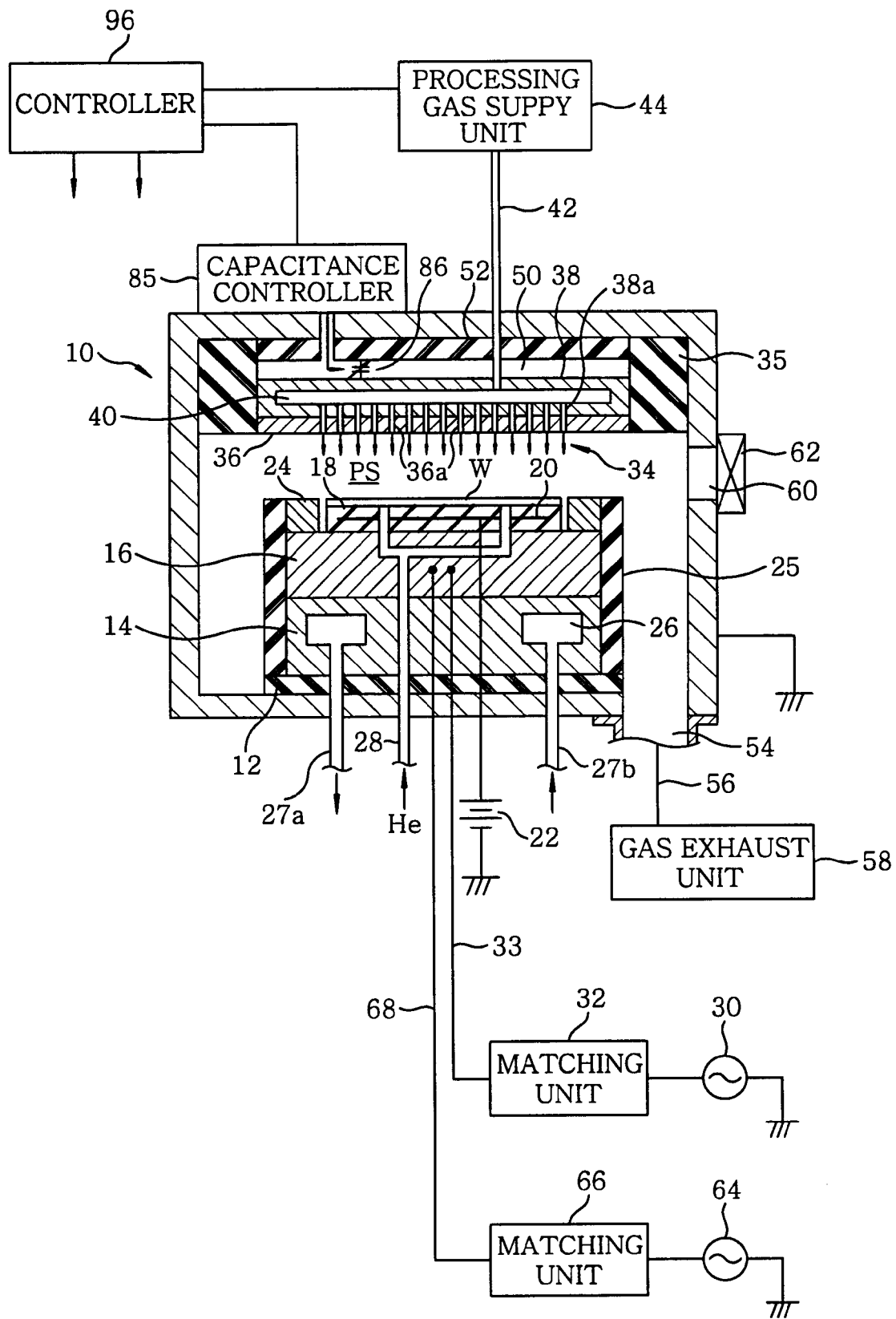
FIG. 5 shows a longitudinal cross sectional configuration view of a modification example of the plasma etching apparatus in accordance with the embodiment of the present invention.

Further, the apparatus can be configured as a lower electrode dual frequency type, in which a lower electrode is supplied with a first radio frequency power of a relatively radio frequency (e.g., about 40 MHz) suitable for plasma generation and, at the same time, a second radio frequency power of a relatively low frequency (e.g., about 2 MHz) suitable for ion attraction. In this configuration, it is preferable that, as shown in FIG. 5, the apparatus further includes a radio frequency power supply 64 for supplying the second radio frequency power, a matching unit 66 and a power supply rod 68. In this lower electrode dual frequency type, the density of the plasma generated in the processing space PS is optimized by the first radio frequency power (of about 40 MHz), and the self-bias voltage and ion sheath occurred at the susceptor 16 can be appropriately controlled by the second radio frequency power (of about 2 MHz). Thus, an anisotropic etching with a higher selectivity becomes possible.

Figure 6:
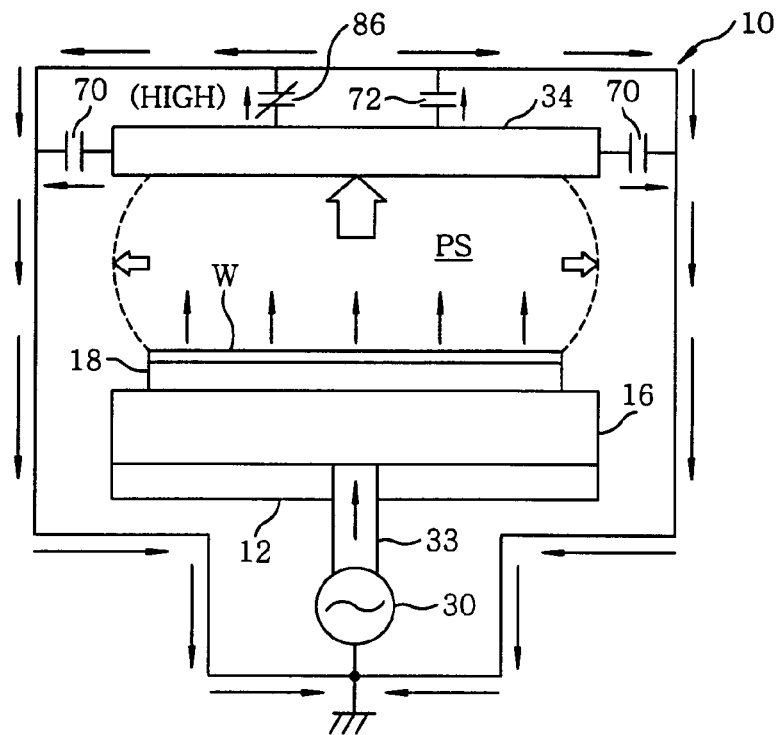
FIG. 6 depicts a schematic diagram for describing a radio frequency discharge in a chamber when an operation mode of the plasma etching apparatus is converted into a high capacitance (low impedance) grounded mode.
Figure 7:
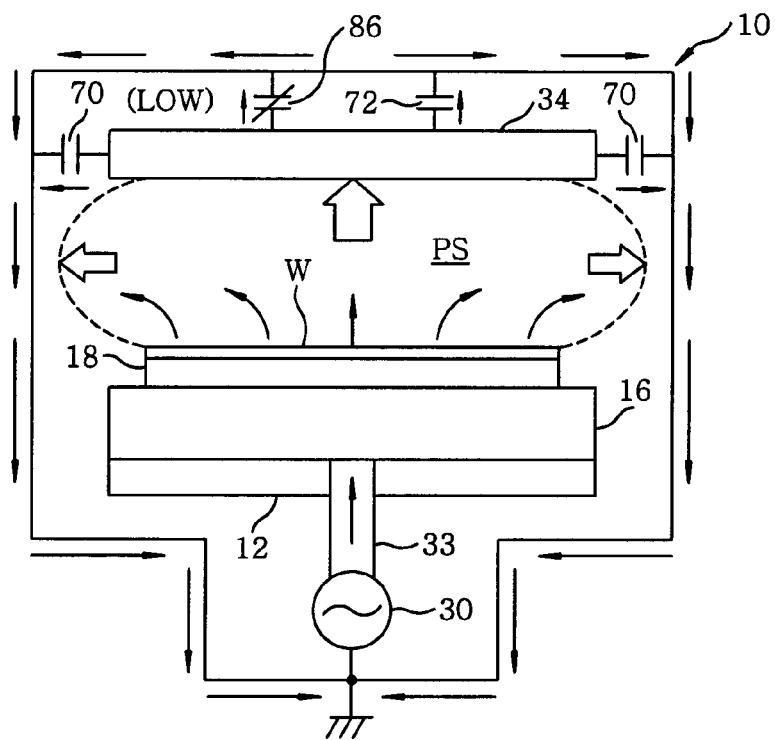
FIG. 7 provides a schematic diagram for describing a radio frequency discharge in the chamber when the operation mode of the plasma etching apparatus is converted into a low capacitance (high capacitance) grounded mode.

Now, an operation of the variable capacitor (capacitance varying unit) 86 in the plasma etching apparatus will be explained. In FIGS. 6 and 7, the upper electrode 34 is electrically connected (grounded) to the chamber 10 that has a ground potential via the variable capacitor 86 and fixed capacitors (which are capacitive elements 70 and 72). Here, the capacitive element 70 is equivalent to a capacitance (fixed capacitance) between the upper electrode 34 and the sidewall of the chamber 10 and is formed mainly via the ring-shaped insulator 35. Meanwhile, the capacitive element 72 is equivalent to a capacitance (fixed capacitance) between the upper electrode 34 and the ceiling of the chamber 10, and is in parallel with the variable capacitor 86. An electrostatic capacitance (or a ground capacitance) around the upper electrode 34 is equivalent to a total capacitance of the variable capacitor 86 and the capacitive elements 70 and 72.

First, there will be explained a case where the ground capacitance (total capacitance) around the upper electrode 34 is set to be greater tan or equal to, e.g., 20000 pF (in the extreme case, the ground capacitance is set to be infinite by bringing the conductive plate 88a or 88b into contact with the upper electrode plate 34) by controlling the capacitance of the variable capacitor 86 to be high. In this case, as shown in FIG. 6, when the radio frequency power from the radio frequency power supply 30 is applied to the susceptor 16, a plasma of the processing gas is generated in the processing space PS by a radio frequency discharge between the susceptor 16 and the upper electrode 34 and that between the susceptor 16 and the sidewall of the chamber 10. The plasma thus generated is diffused in all directions, especially in upward and radially outward directions. Electron current in the plasma flows toward the ground via the upper electrode 34, the sidewall of the chamber 10 or the like.

In the susceptor 16, as the frequency of the radio frequency power increases, a radio frequency current is likely to be gathered at the central portion of the susceptor due to skin effect. Further, since the upper electrode 34, that is opposite to the susceptor 16, is grounded via a high capacitance, i.e., a low impedance, most of the plasma electron current flows in the upper electrode 34, especially in the central portion thereof, while only a small part of the plasma electron current flows in the sidewall of the chamber 10. As a result, a spatial distribution of a plasma density tends to be of a mountain-like shape in which a plasma density is highest at an electrode central portion and gradually reduces toward an electrode edge portion in an outward radial direction. Since, however, a greater amount of radio frequency current or electron current flows to the upper electrode 34, the amount of ions drawn onto the upper electrode 34 by the self bias is increased, whereby a sputtering effect can be enhanced.

In contrast, if the ground capacitance (total capacitance) around the upper electrode 34 is set to be smaller than or equal to, e.g., 250 pF by controlling the capacitance of the variable capacitor 86 to be low, the plasma distribution in the processing space PS expands outward in the radial direction. In this case as well, when the radio frequency power from the radio frequency power supply 30 is applied to the susceptor 16, the plasma of the processing gas is generated in the processing space PS by a radio frequency discharge between the susceptor 16 and the upper electrode 34 and that between the susceptor 16 and the sidewall of the chamber 10. The plasma thus generated is diffused in upward and radially outward directions, and an electron current in the plasma flows toward the ground via the upper electrode 34, the sidewall of the chamber 10 or the like. In the susceptor 16, similarly to the case shown in FIG. 7, a radio frequency current is likely to be gathered at the central portion of the susceptor.

However, since the ground capacitance around the upper electrode 34 low (or an impedance thereof is high), the radio frequency current does not flow easily to the upper electrode 34 disposed directly above the susceptor 16 even though it is gathered at the central portion of the susceptor 16. For this reason, a proportion of electron current that flows to the sidewall of the chamber 10 cannot be considered to be low in the plasma, and it is possible to control a ratio of electron current flowing between the susceptor 16 and the upper electrode 34 and that flowing between the susceptor 16 and the sidewall of the chamber 10 by controlling the ground capacitance (i.e., by controlling the capacitance of the variable capacitor 86). Meanwhile, if the amount of radio frequency current or electron current flowing to the upper electrode 34 is reduced, the amount of ions incident on the upper electrode 34 (or the sputtering effect) may be reduced.

The plasma etching apparatus in accordance with the embodiment of the present invention has a configuration capable of controlling the electrostatic capacitance of the variable capacitor 86. By properly adjusting the ground capacitance of the upper electrode 34, especially by selecting either one of a high capacitance (low impedance) mode or a low capacitance (high impedance) mode based on process conditions, a balance or tradeoff between an enhancement in the process uniformity and a prevention or reduction of a memory effect (that will be described later) can be optimized. Thus, the production ability of the whole process can be improved.

Now, an exemplary etching process performed by the plasma etching apparatus in accordance with the embodiment of the present invention will be described. This etching process is to form a contact hole (via hole) in an organic low-k film serving as an interlayer insulating film, and performed by using a lower electrode dual frequency type (see FIG. 5) in which two electric powers of different frequencies are applied to a lower electrode.

Figure 8:
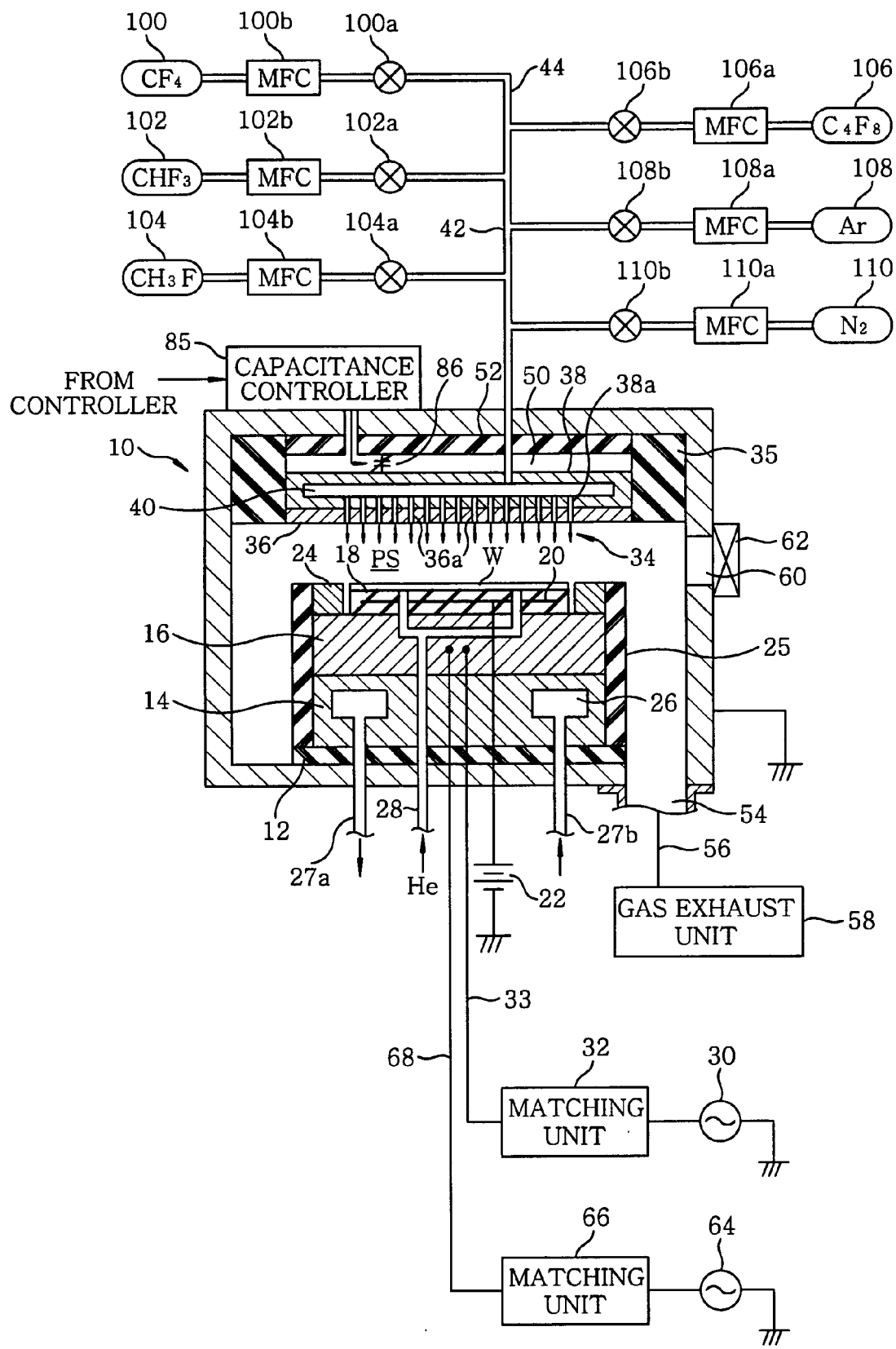
FIG. 8 is a longitudinal cross sectional configuration view of a plasma etching apparatus used in an etching method in accordance with an embodiment of the present invention.

FIG. 8 shows a detailed configuration of the processing gas supply unit 44 in accordance with the present embodiment. Various source gas supply units are connected to a main gas supply line 42 via respective dedicated (or branched) gas supply lines to form a processing gas supply system. In this example, since six types of gases including $CF_4$, $CHF_3$, $CH_3F$, $C_4F_8$, Ar and $N_2$ are employed as source gases for composing a gaseous mixture serving as an etching gas, there are provided gas supply lines 100 to 110 for supplying these source gases. Mass flow controllers (MFC) 100a to 110a and valves 100b to 110b, which are controlled by a controller 96 individually as desired, are installed in the respective dedicated gas supply lines.

On a main surface of a semiconductor wafer W that is a target object of the etching process, as shown in FIG. 9, a lower wiring layer 112 in a multilayer interconnection structure, a barrier layer 114, an organic low-k film (interlayer insulating film) 116 and a mask 118 are deposited in this order from the bottom. The wiring layer 112 is, e.g., a Cu wiring layer formed by, e.g., a dual damascene method. The barrier layer 114 is, e.g., a silicon nitride (SiN) film having a thickness of, e.g., about 1000 Å (0.1 μm), and is formed by, e.g., a chemical vapor deposition (CVD) method. The organic low-k film 116 is, e.g., a SiOC-based low-k film having a thickness of, e.g., about 1 μm, and is formed by, e.g., a CVD method. The mask 118 is a resist film formed by a conventional photolithography, and is provided with an opening 118a at a location below which a via hole is to be formed.

In this example, the etching process is performed on the semiconductor wafer W in three steps. As a first step, an etching in a deposition process is conducted. Major etching conditions for the first step are as follows:

flow rates of processing gass:

$CH_4/CH_3F/N_2=50/5/100$ sccm;

pressure in the chamber: 20 mTorr;
radio frequency powers: 40 MHz/2 MHz=1000 W/0 W.

In the first step, a perfluorocarbon-based $CH_3F$ gas is used as an etching gas. In this case, hydrogen dissociated into a plasma state in the $CH_3F$ gas are likely to react with fluorine to be exhausted as HF, thereby leaving only carbon unexhausted. As a result, a great amount of carbon-based deposits are generated to be attached to the opening 118a and a top surface of the photoresist mask 118 and vicinities thereof, thereby forming a protective film that causes selectivities in subsequent processes to be increased. However, since a great amount of polymer is generated and, also, a second radio frequency power (2 MHz) is not applied to the susceptor 16 (which makes the ion attraction of the upper electrode 34 weaker), the deposits are likely to stick to the upper electrode 34.

To solve this problem, the ground capacitance of the upper electrode 34 is converted into the high capacitance (low impedance) mode by increasing the capacitance of the variable capacitor 86 as shown in FIG. 5. In the extreme case, the upper electrode 34 is short-circuited to the ground. In this manner, the efficiency of drawing the ions onto the upper electrode 34 can be improved, whereby the ion sputtering can be facilitated to prevent a deposit film from being attached thereto.

Figure 9A:
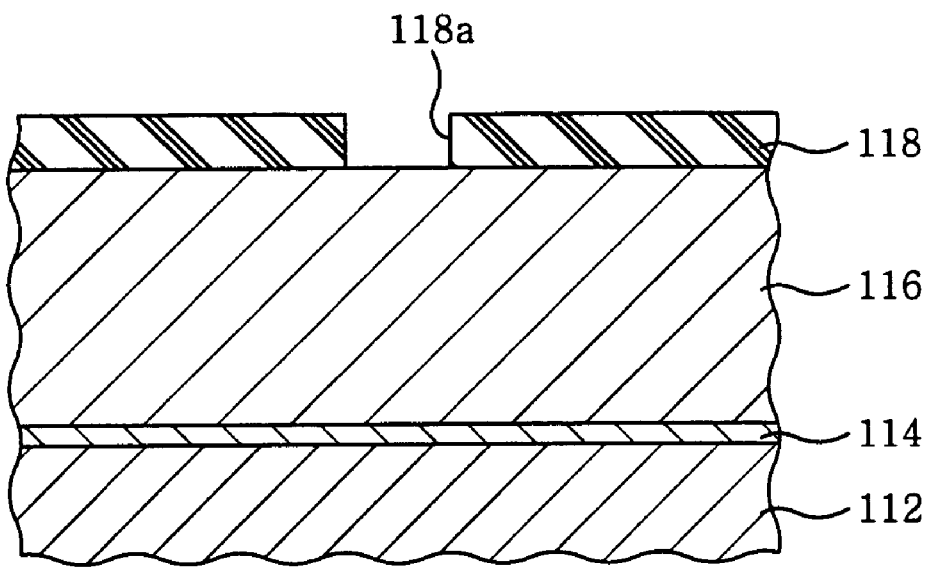
FIGS. 9A to 9D provide schematic cross sectional views showing respective states of multiple steps of the etching method in accordance with the embodiment of the present invention.
Figure 9B:
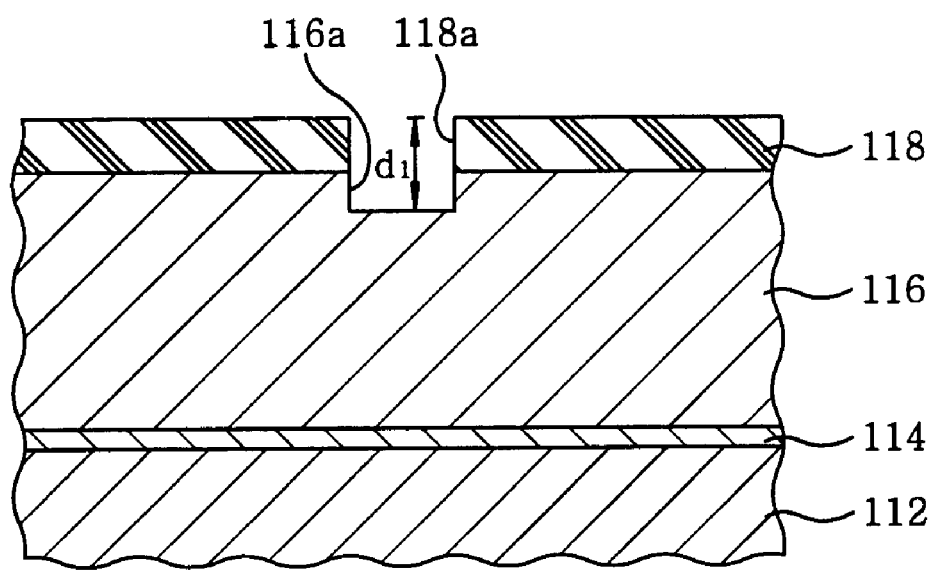

As illustrated in FIG. 9B, the first step is terminated when the bottom of a hole 116a formed in the organic low-k film 116 reaches a specific depth $d_1$ (e.g., a depth of about 1000 Å). When finishing the first step, the supply of the gaseous mixture of $CF_4/CH_3F/N_2$ is stopped. More specifically, the valves 100b, 104b and 110b are closed, and, at the same time, the output of the radio frequency power supply 30 is turned off. However, the operation of the gas exhaust unit 58 is allowed to be continued.

Then, a main etching is performed as a second step. Major etching conditions for the second step are as follows:

flow rates of processing gases:

$CHF_3/CF_4/Ar/N_2$=40/30/1000/150 sccm;

pressure in the chamber: 30 mTorr;

radio frequency powers: 40 MHz/2 MHz=1000 W/1000 W.

In the second step, an ion-assisted etching by ion incidence is performed in addition to a plasma-assisted etching by chemical reactions, so that a high-speed anisotropic etching is carried out. Herein, the second step is started while no deposit film generated in the first step is adhered onto the upper electrode 34. Thus, the second step can be conducted without being affected by the first step.

However, a great amount of polymer is generated from the perfluorocarbon-based $CHF_3$ gas during the second step. Therefore, although not so much as in the first step, deposits still tend to be attached to the upper electrode 34. Further, since a processing time of the second step is relatively long, it is highly probable that a deposit film is accumulated and grows to a considerable degree.

To cope with this problem, in the second step as well, the electrostatic capacitance around the upper electrode 34 is set to be at the high capacitance ground mode as in FIG. 5 (in the extreme case, the upper electrode 34 is short-circuited to the ground). As a result, the efficiency of drawing ions onto the upper electrode 34 can be improved, whereby the ion sputtering can be facilitated to prevent a deposit film from being attached thereto.

Figure 9C:
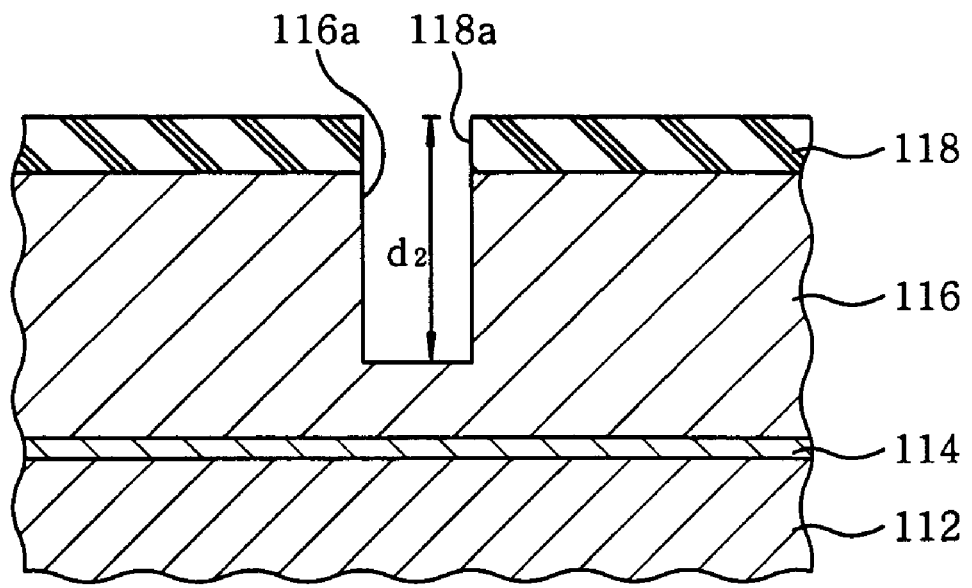
Figure 9D:
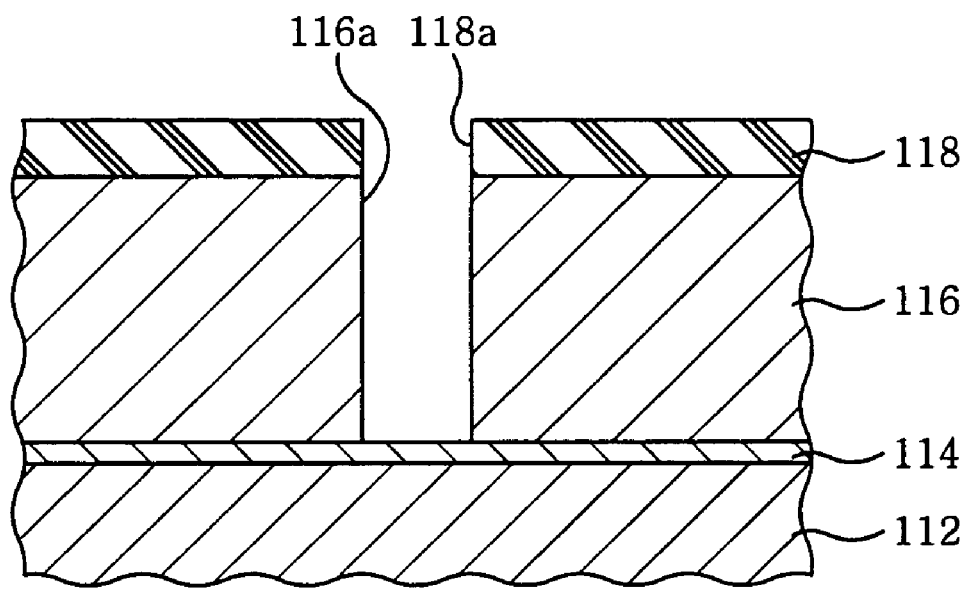

The second step is terminated if the bottom of the hole 116a in the organic low-k film 116 reaches a specific depth $d_2$ (e.g., a depth of about 8000 Å) as illustrated in FIG. 9C. When finishing the second step, the valves 100b, 102b, 108b, and 110b are closed, and the supply of the gaseous mixture of $CHF_3/CF_4/Ar/N_2$ is stopped. At the same time, the outputs of the radio frequency power supplies 30 and 64 are turned off temporarily.

Thereafter, an over-etching is performed as a final third step. Major etching conditions for the third step are as follows:

flow rates of processing gases:

$C_4F_8/Ar/N_2$=6/1000/150 sccm;

pressure in the chamber=50 mTorr;

radio frequency powers: 40 MHz/2 MHz=1000 W/1000 W.

In the third step, the etching of the low-k film 116 is continued until the hole 116a reaches its under layer (SiN) 114 while maintaining the anisotropy (in a vertical shape). Here, since the third step is started while no deposit film generated in the second step is adhered to the upper electrode 34, the third step can be conducted without being affected by the second step.

The gaseous mixture of $C_4F_8/Ar/N_2$ used as the etching gas in the third step has a high selectivity against the under layer (SiN) 114. Further, although fluorocarbon polymer is generated in the third step, its amount is relatively small, and there is no subsequent process following the third step. Therefore, even if a deposit film is adhered to the upper electrode 34 during the third step, a memory effect that a prior process affects a subsequent process due to the presence of the deposit film can be considered to be negligible. Further, deposit films adhered to the upper electrode 34 and the sidewall of the chamber 10 can be removed by an additional processing such as plasma cleaning.

For this reason, in the third step, the ground capacitance of the upper electrode 34 is converted into the low capacitance (high impedance) mode as shown in FIG. 6. In this manner, the electron current flowing between the susceptor 16 and the upper electrode 34 can be relatively reduced, while that flowing between the susceptor 16 and the sidewall of the chamber 10 is relatively increased. As a result, the plasma generated in the processing space can be expanded outward in the radial direction.

In this case, while the etching rate of the semiconductor wafer W may be uniformized spatially (particularly, in the radial direction), it is preferable to set the etching rate at a wafer central portion to be relatively higher than that at a wafer edge portion. In the first and the second step, since the prevention of the memory effect is estimated to be important, the ground capacitance of the upper electrode 34 is set to be high. Therefore, the plasma density tends to be relatively higher at the wafer central portion than at the wafer edge portion, whereby the etching rate of the via hole is also likely to be higher at the wafer central portion that at the edge portion. Therefore, a spatial discrepancy (particularly, in the radial direction) occurs at a bottom depth of the via hole 116a at the end of the second step, such that the hole 116a is relatively deep at its central portion and relatively shallow at its edge portion.

Considering this, in the final third step, the plasma density at the wafer central portion is made to be relatively lower than that at the wafer edge portion. Thus, the etching rate of the semiconductor wafer W becomes relatively higher at the edge portion than at the central portion thereof, whereby the discrepancy in the etching depth described above can be counterbalanced to some extent. As a result, the in-surface uniformity of the etching rate of the entire process throughout the first to the third step can be improved.

As described above, in accordance with the present embodiment, the ground capacitance of the upper electrode 34 is set to be controlled based on process conditions. For example, if a deposit film is easily attached onto the upper electrode 34 during a current process that is to be followed by a subsequent process, the ground capacitance of the upper electrode 34 is converted into the high capacitance (low impedance) ground mode in the current process so as to make it difficult for the deposit film to adhere to the upper electrode. Thus, the memory effect (i.e., an influence of the prior process on the subsequent process) can be prevented or reduced.

On the other hand, if a deposit film is not easily attached onto the upper electrode 34 during the current process, or if the current process is the final process, the ground capacitance of the upper electrode 34 is converted into a low capacitance (high impedance) mode in the current process. Thus, the density of plasma generated in the processing space PS can be expanded outward in the radial direction, and the process uniformity can be enhanced.

In the above description, the etching of the via hole in the low-k film is merely an example, and the present invention can be applied to any single-step or multi-step process. Further, the plasma etching apparatus can employ a configuration or method in which a DC voltage is controllably applied to the upper electrode 34 from a DC power supply (not shown) electrically connected to the upper electrode 34. In this case, the upper electrode 34 is operated DC-wise in an electrically floating state with respect to the potential of the chamber 10 (i.e., the ground potential).

Moreover, as another embodiment, the electrostatic capacitance of the upper electrode 34 may be set to be controlled based on the number of wafers that are processed. In general, as the temperature of the components in the chamber increases by the plasma, the etching rate of the wafer edge portion tends to decrease. Regarding this, in an initial stage of etching, the uniformity of etching rate is maintained by increasing the etching rate at a wafer central portion to keep up with a rise in the etching rate at a wafer edge portion. If the number of the processed wafers increases and the etching rate of the wafer edge portion decreases, the electrostatic capacitance of the capacitance varying unit is set to be small, whereby the decrease in the etching rate at the wafer edge portion is reduced.

The frequencies of the radio frequency powers used in the above description of the embodiments of the present invention are merely examples, and other frequencies can be used depending on a process involved. Further, configurations of respective elements in the apparatus can be modified in various ways. In particular, the configurations of the variable capacitor are merely examples, and any other configuration can be used in the variable capacitor as long as the electrostatic capacitance around the upper electrode 34 or the ground capacitance can be varied within a desired range.

Moreover, though the above embodiments have been described for the plasma etching apparatus and the plasma etching method, the present invention can be applied to other various plasma processing apparatuses and methods for, e.g., plasma CVD, plasma oxidation, plasma nitridation, sputtering, etc. Further, the target object is not limited to the semiconductor wafer, but can be one of various types of substrate for a flat panel display, a photo mask, a CD substrate, a printed circuit board, etc.

While the invention has been shown and described with respect to the embodiments, it will be understood by those skilled in the art that various changes and modifications may be made without departing from the scope of the invention has defined in the following claims.

What is claimed is:

1. A plasma processing method for performing a plasma process on substrates by using a plasma generated in a processing space,
   wherein a first and a second electrode are disposed in parallel to each other with an interval in a processing vessel that is grounded and capable of being vacuum evacuated, the substrate is supported on the second electrode to face the first electrode, the processing vessel is vacuum evacuated to a pressure level, a processing gas is supplied into the processing space formed between the first electrode, the second electrode and a sidewall of the processing vessel, and a first radio frequency power is supplied to the second electrode to generate the plasma in the processing space, and
   wherein the first electrode is connected to the processing vessel via an insulator or a space, and is electrically coupled to a ground potential via a capacitance varying unit whose electrostatic capacitance is variable, and the electrostatic capacitance of the capacitance varying unit is controlled based on a process condition of the plasma process performed on the substrate.

2. The plasma processing method of claim 1, wherein, in a process in which a deposit film is easily attached to the first electrode, the electrostatic capacitance of the capacitance varying unit is set to be a first value; and, in a process in which a deposit film is not easily attached to the first electrode, the electrostatic capacitance of the capacitance varying unit is set to be a second value, and
   wherein the second value is not higher than the first value.

3. The plasma processing method of claim 1, wherein, in a multi-step process including a plurality of steps, the electrostatic capacitance of the capacitance varying unit is set to be a first value during all of the steps except a final step of the multi-step process; and the electrostatic capacitance of a variable capacitor is set to be a second value during the final step, and
   wherein the second value is not higher than the first value.

4. The plasma processing method of claim 1, wherein the capacitance varying unit includes a variable capacitor.

5. The plasma processing method of claim 1, wherein a second radio frequency power, whose frequency is lower than that of the first radio frequency power, is applied to the second electrode.

6. The plasma processing method of claim 1, wherein a DC voltage is controllably applied to the first electrode.

7. A plasma processing apparatus comprising:
   a processing vessel that is grounded and capable of being vacuum evacuated;
   a first electrode connected to the processing vessel via an insulator or a space;
   a capacitance varying unit whose electrostatic capacitance is variable, electrically connected between the first electrode and a ground potential;
   a second electrode disposed in the processing vessel to be in parallel to the first electrode with an interval, for supporting a target substrate thereon to face the first electrode;
   a processing gas supply unit for supplying a processing gas into a processing space between the first electrode, the second electrode and a sidewall of the processing vessel;
   a first radio frequency power supply unit for applying a first radio frequency power to the second electrode to generate a plasma of the processing gas in the processing space; and
   a capacitance control unit for controlling the electrostatic capacitance of the capacitance varying unit based on a process condition of a plasma process performed on the substrate.

8. The plasma processing apparatus of claim 7, wherein the capacitance control unit sets the electrostatic capacitance of the capacitance varying unit to be a first value in a process in which a deposit film is easily attached to the first electrode, and to be a second value in a process in which a deposit film is not easily attached to the first electrode, and
   wherein the second value is not higher than the first value.

9. The plasma processing apparatus of claim 7, wherein, in a multi-step process including a plurality of steps, the capacitance control unit sets the electrostatic capacitance of the capacitance varying unit to be a first value during all of the steps except a final step of the multi-step process, and to be a second value during the final step, and wherein the second value is not higher than the first value.

10. The plasma processing apparatus of claim 7, wherein the capacitance varying unit includes a variable capacitor.

11. The plasma processing apparatus of claim 7, further comprising:

a second radio frequency power supply unit for applying a second radio frequency power, whose frequency is lower than that of the first radio frequency power, to the second electrode.

12. The plasma processing apparatus of claim 7, further comprising:

a DC power supply for controllably applying a DC voltage to the first electrode.

13. A plasma processing method for performing a plasma process on substrates by using a plasma generated in a processing space, wherein a first and a second electrode are disposed in parallel to each other with an interval in a processing vessel that is grounded and capable of being vacuum evacuated, the substrate is supported on the second electrode to face the first electrode, the processing vessel is vacuum evacuated to a pressure level, a processing gas is supplied into the processing space formed between the first electrode, the second electrode and a sidewall of the processing vessel, and a first radio frequency power is supplied to the second electrode to generate the plasma in the processing space, and wherein the first electrode is connected to the processing vessel via an insulator or a space, and is electrically coupled to a ground potential via a capacitance varying unit whose electrostatic capacitance is variable, and the electrostatic capacitance of the capacitance varying unit is controlled based on the number of substrates on which the plasma process is performed.

14. The plasma processing method of claim 13, wherein the electrostatic capacitance of the capacitance varying unit is set to be high in advance, and reduced as the number of substrates on which the plasma process is performed increases.

15. A plasma processing apparatus comprising:

a processing vessel that is grounded and capable of being vacuum evacuated;

a first electrode connected to the processing vessel via an insulator or a space;

a capacitance varying unit whose electrostatic capacitance is variable, electrically connected between the first electrode and a ground potential;

a second electrode disposed in the processing vessel to be in parallel to the first electrode with an interval, for supporting a target substrate thereon to face the first electrode;

a processing gas supply unit for supplying a processing gas into a processing space between the first electrode, the second electrode and a sidewall of the processing vessel;

a first radio frequency power supply unit for applying a first radio frequency power to the second electrode to generate a plasma of the processing gas in the processing space; and a capacitance control unit for controlling the electrostatic capacitance of the capacitance varying unit based on the number of substrates on which the plasma process is performed.

16. The plasma processing apparatus of claim 15, wherein the capacitance control unit sets the electrostatic capacitance of the capacitance varying unit to be high in advance, and to be reduced as the number of substrates on which the plasma process is performed increases.

17. The plasma processing method of claim 1, wherein, in a process in which a deposit film is easily attached to the first electrode, the electrostatic capacitance of the capacitance varying unit is set to be a first value; and, in a process in which a deposit film is not easily attached to the first electrode, the electrostatic capacitance of the capacitance varying unit is set to be a second value, wherein the second value is not higher than the first value, wherein, in a multi-step process including a plurality of steps, the electrostatic capacitance of the capacitance varying unit is set to be a third value during all of the steps except a final step of the multi-step process; and the electrostatic capacitance of a variable capacitor is set to be a fourth value during the final step, and wherein the fourth value is not higher than the third value.

18. The plasma processing apparatus of claim 7, wherein the capacitance control unit sets the electrostatic capacitance of the capacitance varying unit to be a first value in a process in which a deposit film is easily attached to the first electrode, and to be a second value in a process in which a deposit film is not easily attached to the first electrode, wherein the second value is not higher than the first value.

wherein, in a multi-step process including a plurality of steps, the capacitance control unit sets the electrostatic capacitance of the capacitance varying unit to be a third value during all of the steps except a final step of the multi-step process, and to be a fourth value during the final step, and wherein the fourth value is not higher than the third value.

* * * * *